(12) United States Patent
Baumann et al.

(10) Patent No.: US 8,119,331 B2
(45) Date of Patent: Feb. 21, 2012

(54) PHOTOPOLYMER COMPOSITION USABLE FOR LITHOGRAPHIC PLATES

(75) Inventors: Harald Baumann, Osterode/Harz (DE); Bernd Strehmel, Berlin (DE); Udo Dwars, Herzberg/Harz (DE); Ursula Muller, Herzberg am Harz (DE)

(73) Assignee: Kodak Graphic Communications GmbH, Stuttgart (DE)

( * ) Notice: Subject to any disclaimer, the term of this patent is extended or adjusted under 35 U.S.C. 154(b) by 750 days.

(21) Appl. No.: 12/159,287

(22) PCT Filed: Jan. 2, 2007

(86) PCT No.: PCT/EP2007/000009
§ 371 (c)(1), (2), (4) Date: Jun. 26, 2008

(87) PCT Pub. No.: WO2007/077207
PCT Pub. Date: Jul. 12, 2007

(65) Prior Publication Data
US 2009/0011363 A1    Jan. 8, 2009

(30) Foreign Application Priority Data
Jan. 4, 2006  (DE) .......................... 10 2006 000 783

(51) Int. Cl.
G03F 7/09 (2006.01)
G03F 7/30 (2006.01)
G03F 7/004 (2006.01)

(52) U.S. Cl. .................. 430/302; 430/270.1; 430/284.1

(58) Field of Classification Search ............... 430/270.1, 430/281.1, 284.1, 300, 302
See application file for complete search history.

(56) References Cited

U.S. PATENT DOCUMENTS

| | | | | |
|---|---|---|---|---|
| 3,891,523 A * | 6/1975 | Hisamatsu et al. | ............. | 522/96 |
| 3,960,572 A * | 6/1976 | Ibata et al. | ................. | 430/283.1 |
| 4,725,528 A * | 2/1988 | Koch et al. | .................... | 430/309 |
| 6,207,347 B1 * | 3/2001 | Lundy et al. | ............... | 430/284.1 |
| 6,706,462 B2 * | 3/2004 | Murota et al. | ............. | 430/273.1 |
| 6,902,866 B1 * | 6/2005 | Teng | ............................ | 430/302 |
| 7,175,969 B1 * | 2/2007 | Ray et al. | ................... | 430/278.1 |

FOREIGN PATENT DOCUMENTS

| | | |
|---|---|---|
| EP | 0 582 753 | 12/1995 |
| EP | 0 961 171 | 12/1999 |
| WO | 2004/049068 | 6/2004 |
| WO | 2004/049069 | 6/2004 |

OTHER PUBLICATIONS

Isocyanate HDI Biuret, Jul. 6, 2006.*

* cited by examiner

*Primary Examiner* — Anca Eoff
(74) *Attorney, Agent, or Firm* — J. Lanny Tucker

(57) ABSTRACT

Radiation-sensitive element comprising a substrate and a radiation-sensitive coating comprising (a) at least one component selected from photoinitiators and sensitizer/coinitiator systems which absorbs radiation of a wavelength in the range of 250 to 1,200 nm; (b) at least one free-radical polymerizable oligomer A having an average molecular weight in the range of 3,500 to 9,000 determined by GPC, obtainable by reacting a triisocyanate with (i) at least one acrylic or methacrylic monomer with two free OH groups and at least one (meth)acrylic group and (ii) at least one compound comprising one OH group, at least one (meth)acrylic group and at least one poly(alkyleneoxide) chain in the molecule, wherein the (meth)acrylic monomer (i) is present in an amount of 2 to 20 mole-%, based on the total amount of (meth)acrylic compounds with OH functionality.

16 Claims, No Drawings

PHOTOPOLYMER COMPOSITION USABLE FOR LITHOGRAPHIC PLATES

The present invention relates to radiation-sensitive elements, in particular negative working radiation-sensitive elements whose coating comprises an oligomer prepared from a triisocyanate and (meth)acrylic monomers. The invention furthermore relates to a process for the production of such elements, a radiation-sensitive composition suitable for the production of such elements, as well as a process for the production of an imaged element from such radiation-sensitive elements.

in particular in the visible spectral range is required for new and advanced applications (e.g. exposure by means of lasers) so that the exposure time can be shortened. From an economic point of view it is also important that low-intensity lasers can be used which are less expensive and more reliable than high-intensity lasers. Therefore, efforts have been made for some time to increase the sensitivity of photosensitive mixtures that are to be used in photopolymerizable compositions.

EP-A2-0 355 387 describes a photopolymerizable mixture comprising an acrylic or alkacrylic acid ester of the formula

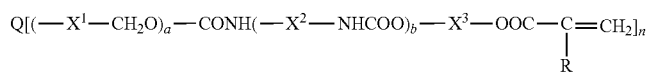

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. soldering masks for printed circuits and printing plates. However, an improved sensitivity a polymeric binder, a photoreducible dye, a trihalogenmethyl compound and a photoinitiator selected from acridine, phenazine and quinoxaline compounds. However, the mentioned esters lead to the formation of sludge in the developer bath.

DE 23 61 041 A1, EP-A1-0 582 753 and JP 2001-117217 describe photopolymerizable coatings comprising monomers with urethane groups and ethylenically unsaturated groups. However, it has been found that such coatings are difficult to develop in an aged state.

WO 94/17452 describes elements having a photosensitive layer on a substrate, which layer comprises a monomer of the following formula:

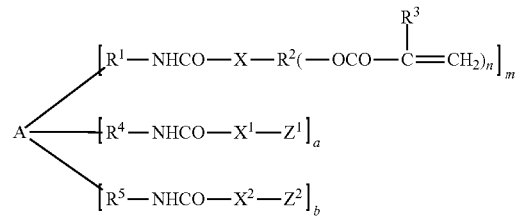

However, the photoreactivity of these monomers is insufficient, and the developability of the elements is unsatisfactory as well.

The U.S. Pat. Nos. 3,856,830; 4,999,271 and 6,207,347 B1 also describe ethylenically unsaturated urethane monomers. While photopolymerizable coatings produced with these monomers exhibit good sensitivity, further improvement would be desirable.

EP-A2-0 424 750 describes ethylenically unsaturated surface-active urethane derivatives produced by reacting monoisocyanates with hydroxypolyoxyalkylene oxycarbonyl alkenes or N-(hydroxypolyoxyalkylene)alkene carboxyamides. If these urethane derivatives are used for the production of radiation-sensitive elements, the resulting sensitivity is insufficient.

It is the object of the present invention to provide novel radiation-sensitive elements exhibiting improved properties compared to those known in the prior art; in particular a high degree of photosensitivity, a high degree of thermal stability and high resolution in combination with good storage stability and—in the case of printing plates—a high run length on the press; furthermore, they should allow rapid development and no or very little easy to remove sludge should be formed in the developer bath.

This object is achieved by providing a radiation-sensitive element comprising
a substrate and
a radiation-sensitive coating comprising
(a) at least one component selected from photoinitiators and sensitizer/coinitiator systems which absorbs radiation of a wavelength in the range of 300 to 1,200 nm;
(b) at least one free-radical polymerizable oligomer A having an average molecular weight in the range of 3,500 to 9,000 determined by GPC, obtainable by reacting a triisocyanate with (i) at least one acrylic or methacrylic monomer with two free OH groups and at least one (meth)acrylic group and (ii) at least one compound comprising one OH group, at least one (meth)acrylic group and at least one poly(alkyleneoxide) chain in the molecule, wherein the (meth)acrylic monomer (i) is present in an amount of 2 to 20 mole-%, based on the total amount of (meth)acrylic compounds with OH functionality.

Unless defined otherwise, the terms "alkyl group and alkylene group" as used in the present invention refer to a straight-chain, branched or cyclic alkyl group or alkylene group. These groups can optionally comprise one or more substituents selected from halogen atoms (fluorine, chlorine, bromine, iodine), $C_1$-$C_{12}$ alkoxy groups,

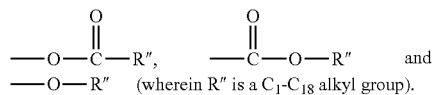

(wherein R″ is a $C_1$-$C_{18}$ alkyl group).

Unless defined otherwise, the terms "aryl group or arylene group" as used in the present invention refer to an aromatic carbocyclic mono- or divalent group with one ring or more fused rings, which can optionally comprise one or more substituents selected from halogen atoms (fluorine, chlorine, bromine, iodine), $C_1$-$C_{12}$ alkoxy groups,

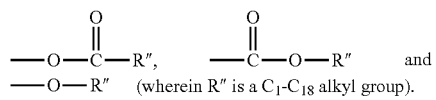

(wherein R″ is a $C_1$-$C_{18}$ alkyl group).

Unless defined otherwise, the term "heterocyclic group" as used in the present invention refers to a saturated or unsaturated (non-aromatic) cyclic group wherein one or more ring carbon atoms are replaced with heteroatoms selected from O, S, Se, Te and N—preferably O, S and N—; preferably, one or two carbon atoms are replaced. Preferably, the group is a 5- or 6-membered heterocyclic group. The heterocyclic group can optionally comprise one or more substituents (bonded to a C atom and/or an N atom). Preferably, the heterocyclic group is unsubstituted or comprises one substituent. The optional substituents are preferably selected from halogen atoms, alkyl groups, CN, $NO_2$, $NR^{IV}_2$, $OR^{IV}$ and $SR^{IV}$, wherein each $R^{IV}$ is independently selected from hydrogen and alkyl. Examples of heterocyclic groups include piperidyl, piperazinyl, tetrahydroquinolinyl, pyrrolidyl, tetrahydrofurfuryl, tetrahydropyranyl, morpholinyl and tetrahydrothiophenyl.

Unless defined otherwise, the term "heteroaromatic group" as used in the present invention refers to an aryl group wherein one or more ring carbon atoms are replaced with heteroatoms selected from O, S, Se, Te and N—preferably O, S and N—; preferably, one, two or three carbon atoms are replaced. The heteroaromatic group can optionally comprise one or more substituents preferably selected from halogen atoms, alkyl groups, CN, $NR^{IV}_2$, $COOR^{IV}$, $OR^{IV}$ and $SR^{IV}$ (especially preferred alkyl groups, $OR^{IV}$ and $SR^{IV}$), wherein each $R^{IV}$ is independently selected from hydrogen and alkyl. The substituents can be bonded to C atoms and/or N atoms. Examples of heteroaromatic groups include imidazolyl, 1,2,4-triazolyl, pyrazolyl, thiazolyl, pyridyl, quinolinyl, pyrimidyl, 1,3,5-thiadiazolyl, 1,3,5-oxadiazolyl, 1,3,5-triazinyl, benzimidazolyl, acridinyl, furanyl and thienyl.

The terms "(meth)acrylate" and "(meth)acrylic acid" indicate that both "methacrylate" and "acrylate" and "methacrylic acid" and "acrylic acid", respectively, are meant.

Oligomer A

The free-radical polymerizable oligomer A is an essential component of the radiation-sensitive coating. The oligomer A comprises acrylate groups, methacrylate groups, or both, and has a weight average molecular weight of 3,500 to 9,000 determined by gel-permeation chromatography (GPC) versus polystyrene standards.

The oligomer A is prepared by reacting a triisocyanate, preferably a triisocyanate of the formula (I), (II) or (III-1) to (III-7), with (i) at least one (meth)acrylic monomer with two free OH groups and (ii) at least one (meth)acrylic compound with one free OH group and a poly(alkyleneoxide) chain, and optionally (iii) at least one (meth)acrylic monomer with one free OH group but no poly(alkyleneoxide) chain; the amount of (meth)acrylic monomer (i) is 2 to 20 mole-%, based on the total amount of (meth)acrylic compounds with OH functionality. The terminal isocyanate groups are reacted with the free OH groups of the (meth)acrylic compounds.

The reaction can be carried out stepwise (i.e. the (meth)acrylic compounds are reacted with the triisocyanate one after the other) or simultaneously (i.e. the (meth)acrylic compounds are all reacted with the triisocyanate at the same time). It is preferred that the reaction be carried out stepwise by first reacting the (meth)acrylic monomer with two free OH groups.

The reaction is usually carried out in aprotic solvents such as e.g. benzene, toluene, xylene, a ketone (e.g. methyl ethyl ketone) or an ester (e.g. butyl acetate) in the presence of a catalyst (e.g. tertiary amines or tin organyls such as dibutyltin dilaurate and dioctyltin dilaurate) and an inhibitor for preventing thermal polymerization at a temperature between room temperature and about 80° C.

Details regarding the preparation of the oligomers A can e.g. be inferred from DE-A-2,361,041. Possibly present unreacted isocyanate groups are quenched by reaction with an alcohol.

The radiation-sensitive coating can comprise one or more types of oligomer A.

The amount of oligomer A in the radiation-sensitive coating (or the total amount if different oligomers A are used) is not particularly restricted, however, it is preferred that the oligomer A be present in an amount of 10 to 90 wt.-% (especially preferred 10 to 70 wt.-%), based on the dry layer weight.

Triisocyanate

The triisocyanate used for the preparation of oligomer A is preferably selected from triisocyanates of formulas (I), (II) and (III-1) to (III-7).

The triisocyanates of formula (I) have a biuret structure

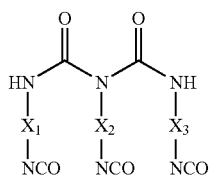

(I)

wherein $X_1$, $X_2$ and $X_3$ are independently selected from aliphatic or cycloaliphatic $C_4$-$C_{12}$ spacers, araliphatic $C_8$-$C_{12}$ spacers and aromatic $C_6$-$C_{10}$ spacers, preferably aliphatic and cycloaliphatic $C_4$-$C_{12}$-Spacern.

Preferably, $X_1=X_2=X_3$.

It is especially preferred that $X_1=X_2=X_3=$hexamethylene.

The basic biuret structure of the triisocyanates (I) can be prepared by reacting at least one diisocyanate of the formula

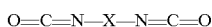

(wherein X is defined as are $X^1$, $X^2$ and $X^3$) and an appropriately selected amount of water, usually 3 moles diisocyanate(s) and 1 mole water (see also e.g. DE-B-1,101,394 and Houben-Weyl, *Methoden der organischen Chemie* [methods in organic chemistry], 4$^{th}$ edition (1963), Vol. 14/2, pages 69 et seqq.). The reaction is preferably carried out without a solvent.

The triisocyanates of formula (II) have a cyanuric acid core

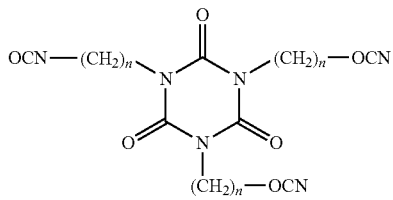

(II)

wherein each n is independently an integer from 1 to 10, preferably 2 to 8, and especially preferred 6; preferably, all variables n in formula (II) are the same.

The triisocyanates of formula (II) can be prepared according to common processes; in particular those wherein all variables n are the same are also commercially available.

The triisocyanates (III) are aromatic or aliphatic triisocyanates of formulas (III-1) to (III-7)

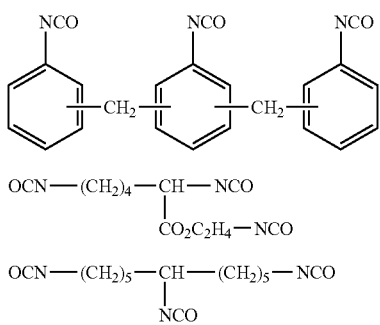

(III-1)

(III-2)

(III-3)

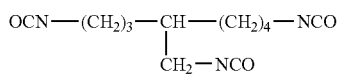

(III-4)

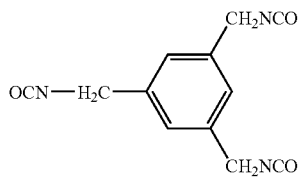

(III-5)

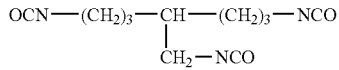

(III-6)

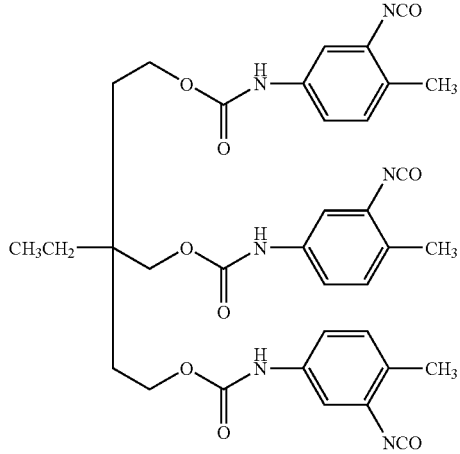

(III-7)

The triisocyanates of formulas (III-1) to (III-7) can be prepared according to common processes, but they are also commercially available.

According to a preferred embodiment, a triisocyanate of formula (I) is used wherein $X_1=X_2=X_3=$hexamethylene.

(Meth)acrylic Compounds with Free OH Groups

All partial esters of trivalent or polyhydric alcohols with acrylic acid or methacrylic acid which still have two free OH groups can for example be used as (meth)acrylic monomers (i) with two OH groups and at least one (meth)acrylic group.

Suitable examples include
pentaerythritol di(meth)acrylate
glycerin mono(meth)acrylate
trimethylolpropane mono(meth)acrylate
trimethylolethane mono(meth)acrylate
trimethylolbutane mono(meth)acrylate
sorbitol tetra(meth)acrylate
reaction product of bisphenol-A-diglycidylether and (meth)acrylic acid Partial esters of divalent or polyhydric alcohols with poly (alkyleneoxide) chains and (meth)acrylic acid which still have one free OH group can for example be used as (meth) acrylic compounds (ii) with one OH group and poly(alkyleneoxide) chains. The poly(alkyleneoxide) chains are preferably ($C_2$-$C_8$ alkylene)oxide chains wherein the alkylene moiety can have a straight chain or branched chain, especially preferred polyethyleneoxide and polypropyleneoxide chains, preferably with a degree of polymerization of at least 3 and preferably not more than 20. Suitable examples include:
poly(ethyleneoxide)mono(meth)acrylate
poly(propyleneoxide)mono(meth)acrylate random copolymers or block copolymers of propyleneoxide and ethyleneoxide, esterified with (meth)acrylic acid at one end ethoxylated and/or propoxylated glycerin, doubly esterified with (meth)acrylic acid All partial esters of divalent or polyhydric alcohols with acrylic acid or methacrylic acid which still have one free OH group can for example be used as optional (meth)acrylic monomers (iii) without poly(alkyleneoxide) chains with at least one (meth)acrylic group and only one OH group.

Suitable examples include:
pentaerythritol tri(meth)acrylate
glycerin di(meth)acrylate
trimethylolpropane di(meth)acrylate
trimethylolethane di(meth)acrylate
trimethylolbutane di(meth)acrylate
trimethylolbutane di(meth)acrylate
sorbitol penta(meth)acrylate Ethoxylated and/or propoxylated glycerin mono-esterified with (meth)acrylic acid can optionally be used as well.

For cost reasons, the use of a technical mixture of (meth) acrylates as component (i) can be considered; examples thereof include glycerin di(meth)acrylate comprising up to 15 wt.-% glycerin mono(meth)acrylate and furthermore up to 40 wt.-% glycerin tri(meth)acrylate;

trimethylolpropane di(meth)acrylate, comprising up to 15 wt.-% trimethylolpropane mono(meth)acrylate and furthermore up to 40 wt.-% trimethylolpropane tri(meth)acrylate;

pentaerythritol tri(meth)acrylate, comprising up to 15 wt.-% pentaerythritol di(meth)acrylate and furthermore up to 40 wt.-% pentaerythritol tetra(meth)acrylate.

Of the above-mentioned methacrylates and acrylates, the methacrylates are preferably used in the present invention since it has been found that they usually lead to more stable and more photosensitive systems.

For the preparation of the oligomers, 2 to 20 mole-% (preferably 5 to 15 mole-%), based on the total amount of (meth) acrylic compounds with OH functionality, of (meth)acrylic monomers (i) with two OH groups are used.

The amount of (meth)acrylic compounds with one free OH group (i.e. the amount of (meth)acrylic compound (II) or, if the optional (meth)acrylic monomers (iii) are present, the total amount of (ii) and (iii)) is preferably 80 to 98 mole-% (especially preferred 85 to 95 mole-%), based on the total amount of (meth)acrylic compounds with OH functionality.

If both (meth)acrylic compound (II) and (meth)acrylic monomers (iii) are present as (meth)acrylic component with one OH group, (ii) is preferably present in an amount of at least 10 mole-%, based on the total amount of (ii) and (iii), especially preferred 20 to 70 mole-%.

(Meth)acrylates with 3 or more OH groups, if present, should account for less than 1 wt-% of the (meth)acrylates with OH functionality.

Absorber Component

The radiation-sensitive coating furthermore comprises at least one absorber component selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is e.g. going to be imaged by means of an IR laser, the absorber should essentially absorb radiation in the range of about 750 to 1,200 nm and preferably show an absorption maximum in that range. On the other hand, if imaging is to be carried out by means of UV/VIS radiation, the absorber should essentially absorb radiation in the range of about 250 to 750 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free radicals by itself, i.e. without the addition of coinitiators. Examples of suitable photoinitiators absorbing UV or VIS radiation include triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4, 6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, and 2-(4-ethoxy-naphtho-1-yl)-4,6-bis(trichloromethyl)-s-triazine and 2-[4-(2-ethoxyethyl)-naphtho-1-yl]-4,6-bis (trichloromethyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

Coumarin sensitizers of formula (A) are for example suitable for the UV range of the electromagnetic spectrum

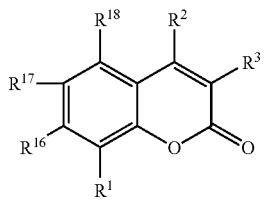

(A)

wherein $R^1$, $R^{16}$, $R^{17}$ and $R^{18}$ are independently selected from —H, a halogen atom, $C_1$-$C_{20}$ alkyl, —OH, —O—$R^4$ and —$NR^5R^6$, wherein $R^4$ is $C_1$-$C_{20}$ alkyl, $C_5$-$C_{10}$ aryl or $C_6$-$C_{30}$ aralkyl (preferably $C_1$-$C_6$ alkyl) and $R^5$ and $R^6$ are independently selected from a hydrogen atom and $C_1$-$C_{20}$ alkyl, or $R^1$ and $R^{16}$, $R^{16}$ and $R^{17}$ or $R^{17}$ and $R^{18}$ together form a 5- or 6-membered heterocyclic ring with a heteroatom, selected from N and O, in one or both positions adjacent to the phenyl ring shown in formula (I), or $R^{16}$ or $R^{17}$ forms, together with each of its two adjacent substituents, a 5- or 6-membered heterocyclic ring with a heteroatom, selected from N and O, in one or both positions adjacent to the phenyl ring shown in formula (I), wherein each formed 5- or 6-membered heterocyclic ring can independently be substituted with one or more $C_1$-$C_6$ alkyl groups, with the proviso that at least one of $R^1$, $R^{16}$, $R^{17}$ and $R^{18}$ is different from hydrogen and $C_1$-$C_{20}$ alkyl, $R^2$ is a hydrogen atom, $C_1$-$C_{20}$ alkyl, $C_5$-$C_{10}$ aryl or $C_6$-$C_{30}$ aralkyl and $R^3$ is a hydrogen atom or a substituent selected from —COOH, —COOR$^7$, —COR$^8$, —CONR$^9R^{10}$, —CN, $C_5$-$C_{10}$ aryl, $C_6$-$C_{30}$ aralkyl, a 5- or 6-membered heterocyclic optionally benzofused group, a group —CH=CH—$R^{12}$ and

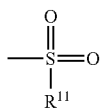

wherein $R^7$ is $C_1$-$C_{20}$ alkyl, $R^8$ is $C_1$-$C_{20}$ alkyl or a 5- or 6-membered heterocyclic group, $R^9$ and $R^{10}$ are independently selected from a hydrogen atom and $C_1$-$C_{20}$ alkyl, $R^{11}$ is $C_1$-$C_{12}$ alkyl or alkenyl, a heterocyclic non-aromatic ring or $C_5$-$C_{20}$ aryl optionally with a heteroatom, selected from O, S and N, and $R^{12}$ is $C_5$-$C_{10}$ aryl or a 5- or 6-membered heterocyclic, optionally aromatic, ring;

or $R^2$ and $R^3$, together with the carbon atoms to which they are bonded, form a 5- or 6-membered, optionally aromatic, ring.

They are described in more detail e.g. in WO 2004/049068 A1.

Furthermore, bisoxazole derivatives and analogues of the formula (B) are suitable for the UV range

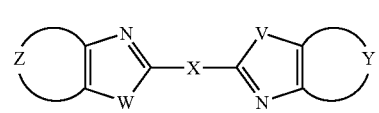

(B)

wherein X is a spacer group comprising at least one C=C double bond conjugated to the heterocycles, Y and Z independently represent an optionally substituted fused aromatic ring and V and W are independently selected from O, S and NR, wherein R is an alkyl, aryl and aralkyl group which can optionally be mono- or polysubstituted, as described in more detail in WO 2004/074929 A2, and oxazole compounds of the formula (C)

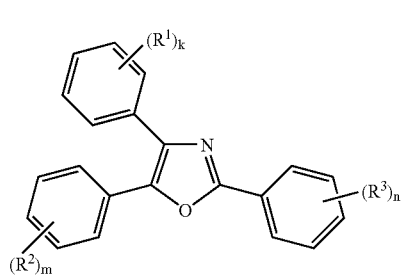

(C)

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$, wherein $R^4$ and $R^5$ are independently selected from a hydrogen atom, an alkyl, aryl or aralkyl group, $R^6$ is an optionally substituted alkyl, aryl or aralkyl group or a hydrogen atom, and k, m and n are independently 0 or an integer from 1 to 5, as described in detail in WO 2004/074930 A2.

The 1,4-dihydropyridine compounds of formula (D) as described in WO 2004/111731 A1 are an example of another class of sensitizers suitable for the UV range

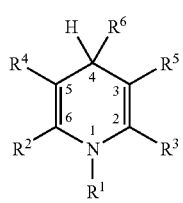

(D)

wherein $R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8R^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

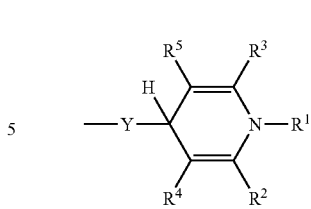

Y is an alkylene or arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

The sensitizers of formula (E)

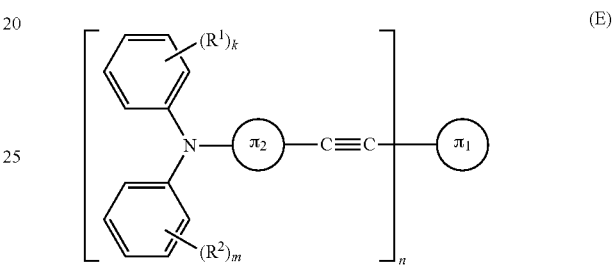

wherein

Ⓢ and each Ⓢ independently represent an aromatic or heteroaromatic unit, each $R^1$ and $R^2$ is independently selected from a halogen atom, an alkyl, aryl or aralkyl group, a group —$NR^4R^5$ or a group —$OR^6$, $R^4$, $R^5$ and $R^6$ are independently selected from an alkyl, aryl and aralkyl group and n is an integer of at least 2 and k and m independently represent 0 or an integer from 1 to 5, as well as the oligomeric or polymeric compounds of formula (F)

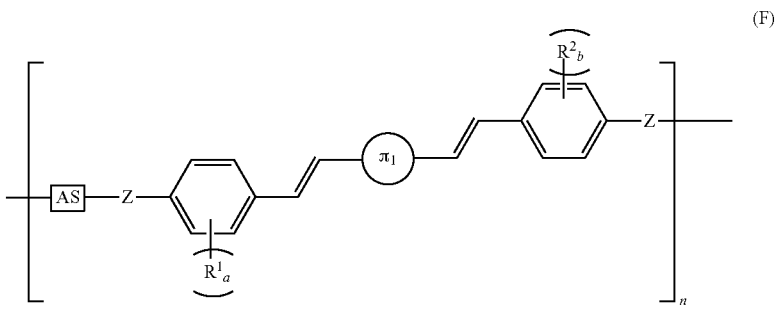

wherein Ⓢ is an aromatic or heteroaromatic unit or a combination of the two so that a conjugated π-system is present between the two groups Z in structure (I), each Z independently represents a heteroatom connecting the spacer AS and the conjugated system, each $R^1$ and $R^2$ is independently selected from a halogen atom, an alkyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, are also suitable for UV-sensitive elements.

If the radiation-sensitive elements are to be exposed with VIS laser diodes, the cyanopyridone derivatives described in WO 03/069411 A1 are for example suitable as sensitizers.

For IR-sensitive elements, the sensitizers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP-A-1 176 007.

According to one embodiment, a cyanine dye of formula (IV)

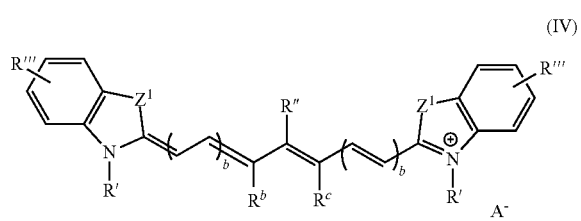

is used, wherein each $Z^1$ independently represents S, O, $NR^a$ or $C(alkyl)_2$;

each R' independently represents an alkyl group, an alkylsulfonate group or an alkylammonium group;

R" represents a halogen atom, $SR^a$, $OR^a$, $SO_2R^a$ or $NR^a_2$;

each R'" independently represents a hydrogen atom, an alkyl group, —$COOR^a$, —$OR^a$, —$SR^a$, —$NR^a_2$ or a halogen atom; R'" can also be a benzofused ring;

$A^-$ represents an anion;

$R^b$ and $R^c$ either both represent hydrogen atoms or, together with the carbon atoms to which they are bonded, form a carbocyclic five- or six-membered ring;

$R^a$ represents a hydrogen atom, an alkyl or aryl group;

each b is independently 0, 1, 2 or 3.

If R' represents an alkylsulfonate group, an internal salt can form so that no anion $A^-$ is necessary. If R' represents an alkylammonium group, a second counterion is needed which is the same as or different from $A^-$.

$Z^1$ is preferably a $C(alkyl)_2$ group.

R' is preferably an alkyl group with 1 to 4 carbon atoms.

R" is preferably a halogen atom or $SR^a$.

R'" is preferably a hydrogen atom.

$R^a$ is preferably an optionally substituted phenyl group or an optionally substituted heteroaromatic group (for example, in the case of $SR^a$, the sulfur atom can form part of the aromatic ring).

Preferably, $R^b$ and $R^c$, together with the carbon atoms to which they are bonded, form a carbocyclic five- or six-membered ring.

The counterion $A^-$ is preferably a chloride ion, trifluoromethylsulfonate or a tosylate anion.

Of the IR dyes of formula (II), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indoliumtosylate and 2-[2-[2-chloro-3-[2-ethyl-(3H-benzthiazole-2-ylidene)-ethylidene]-1-cyclohexene-1-yl]-ethenyl]-3-ethyl-benzthiazoliumtosylate.

The following compounds are also IR absorbers suitable for the present invention:

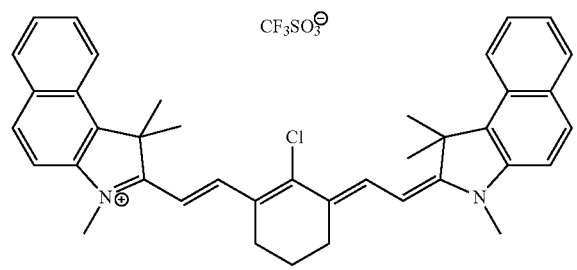

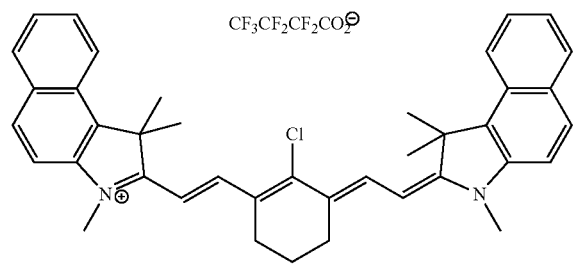

-continued
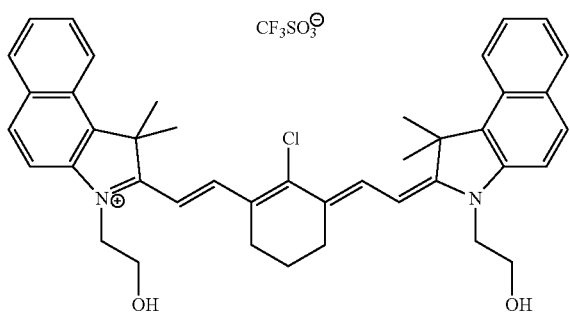
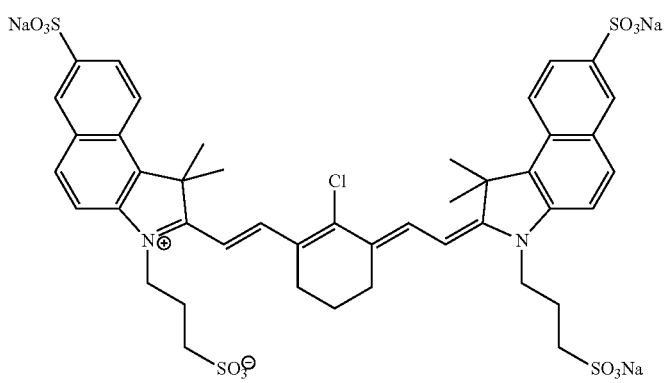
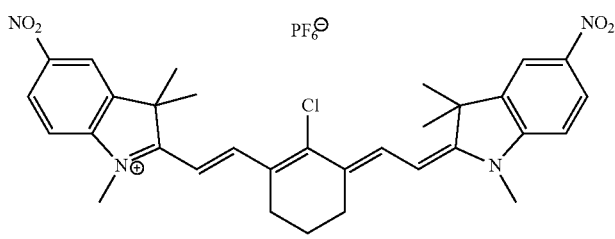
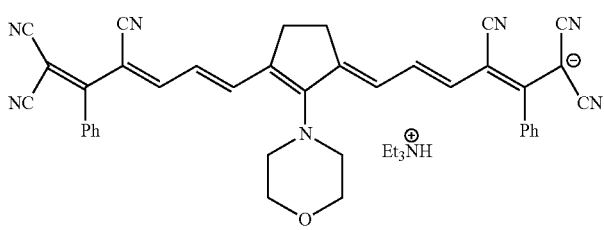
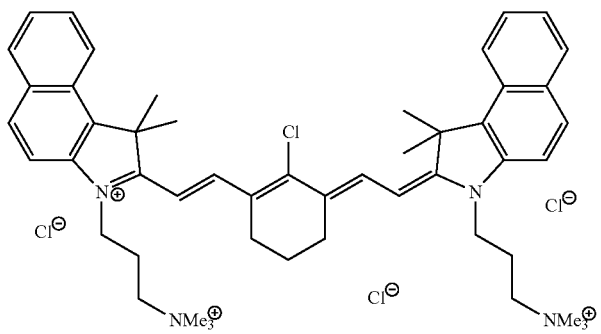

-continued
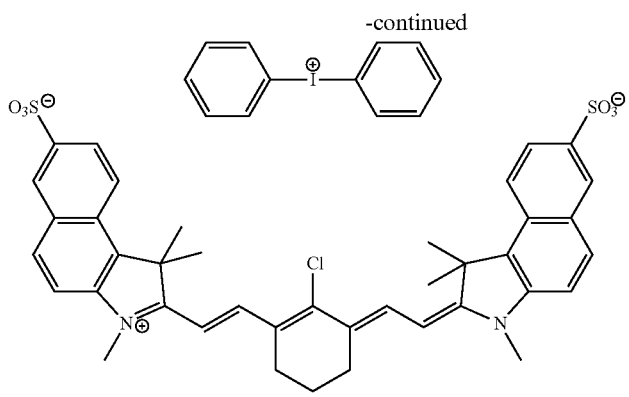
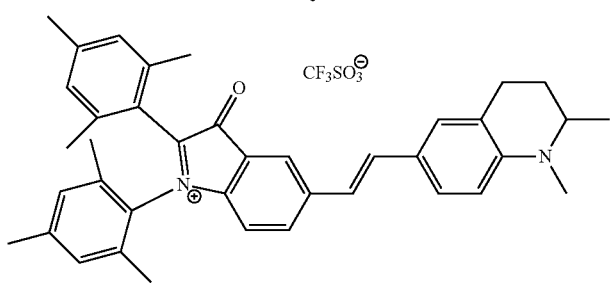
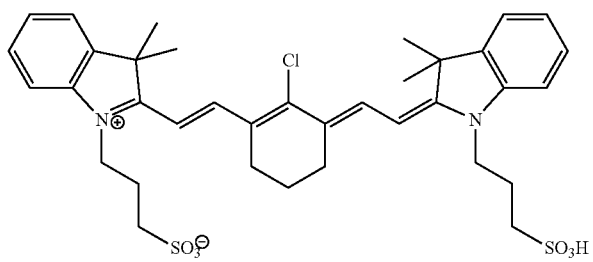
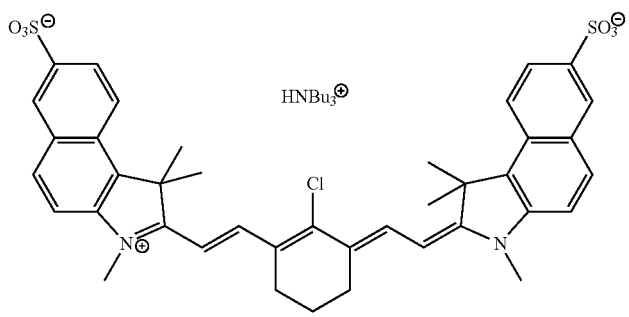
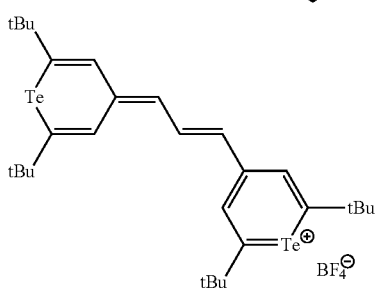

-continued
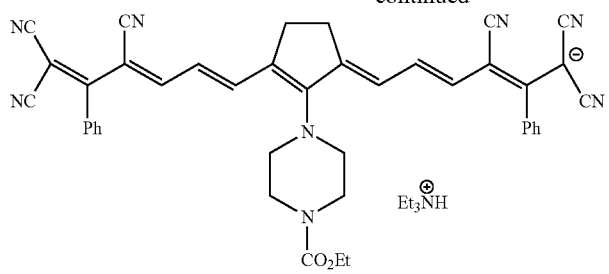
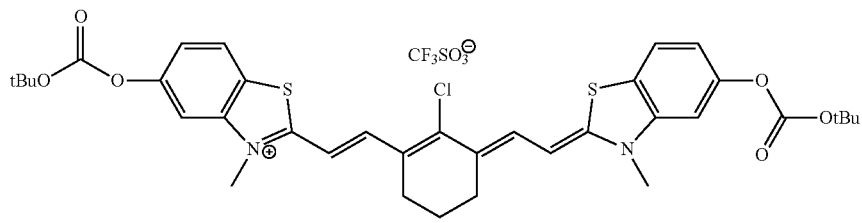
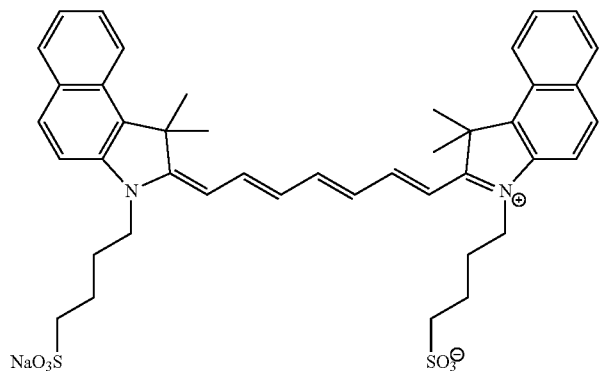
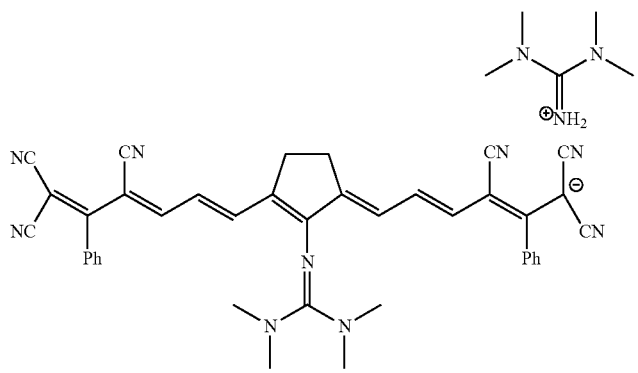
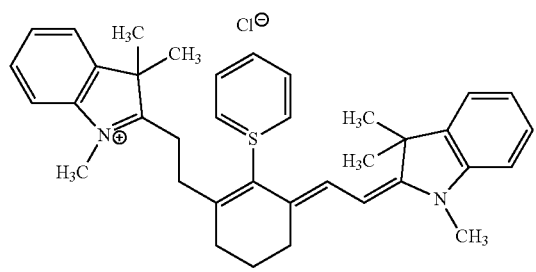

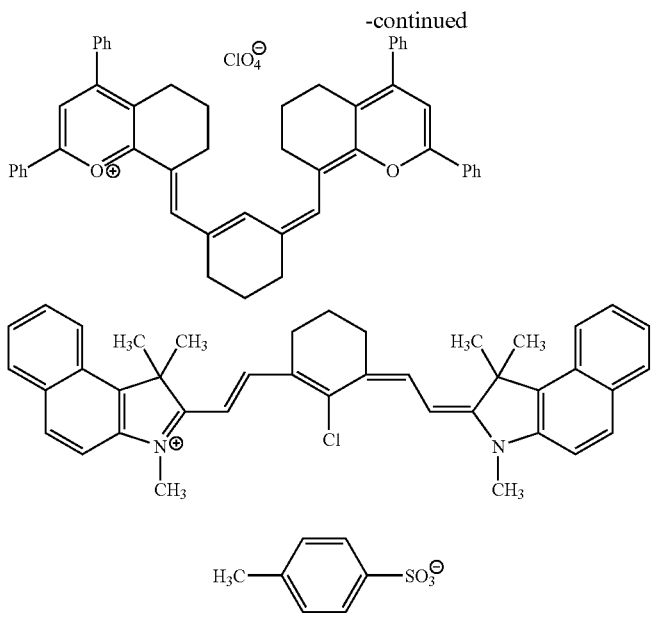

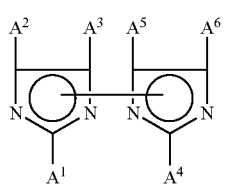

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when irradiated but forms free radicals together with the radiation-absorbing sensitizers used in the present invention. The coinitiators are for example selected from onium compounds, for example those where the onium cation is selected from iodonium (such as e.g. triaryliodonium salts), sulfonium (such as triarylsulfonium salts), phosphonium, oxysulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium); acylphosphine oxides, diacylphosphine oxides and peroxides (e.g. those listed in EP-1 035 435 A1 as activators of the type of an organic peroxide), α-hydroxy or α-amino acetophenones, acylphosphines, acylphosphinesulfides, carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (V):

$$(V)$$

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)biimidazole,
2,2'-bis(p-chlorophenyl)-4,4',5,5'-tetrakis(p-methoxyphenyl)biimidazole,
2,2'-bis(p-cyanophenyl)-4,4'5,5'-tetrakis(p-methoxyphenyl) biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl) biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)biimidazole,
2,2'-di-9-phenanthryl-4,4',5,5'-tetrakis(p-methoxyphenyl) biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl) biimidazole, and
2,2'-bis(2-chloro-5-sulfophenyl)-4,4',5,5'-tetraphenylbiimidazole, and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl) biimidazole,
2,2'-bis(o-chlorophenyl)-4,4',5,5'-tetra(o,p-dibromophenyl) biimidazole,
2,2'-bis(o-bromophenyl)-4,4',5,5'-tetra(o,p-dichlorophenyl) biimidazole or
2,2'-bis(o,p-dichlorophenyl)-4,4',5,5',-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(III)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4', 2,2'-, 2,4'- and 4,4'-isomer), as long as it is photodissociable and provides triarylimidazolyl free radicals in the process.

The trihalogenmethyl compounds suitable as coinitiators are capable of forming free radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tris-(trichloromethyl)-s-triazine,
2,4,6-tris-(tribromomethyl)-s-triazine and
tribromomethylphenylsulfone.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

Further examples of suitable sensitizers and coinitiators for IR-sensitive coatings are also mentioned in WO 2004/041544, WO 2000/48836 and DE 10 2004 003143.

Optional Components

In addition to the free-radical polymerizable oligomers A, the radiation-sensitive coating can also comprise other C—C unsaturated monomers and/or oligomers and/or polymers which comprise at least one C—C double or triple bond. Such compounds are well known to the person skilled in the art and can be used in the present invention without any particular limitations. Esters of acrylic and methacrylic acids, itaconic acid, crotonic acid and isocrotinic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride-olefin-copolymers and hydroxyalkyl(meth)-acrylates; polyesters comprising an allylalcohol ester group; reaction products of polymeric polyalcohols and isocyanato(meth)acrylates; unsaturated polyesters; (meth)acrylate-terminated polystyrenes, poly(meth)acrylic acid ester, poly(meth)acrylic acids, poly(meth)acrylamides and polyethers. In this connection, the prefix "(meth)" indicates that both derivatives of acrylic acid and of methacrylic acid can be used.

Additional suitable C—C unsaturated free-radical polymerizable compounds are described e.g. in EP-A-1 176 007.

According to one embodiment, the radiation-sensitive coating comprises a tri(meth)acrylate of a trishydroxy compound such as e.g. glycerin tri(meth)acrylate; if such a tri(meth)acrylate is present, it is preferable present in an amount of 2 to 20 wt.-%, based on the total amount of all (meth)acrylates used.

The free-radical polymerizable monomers, oligomers or polymers different from oligomer A are preferably present in an amount of 0 to 40 wt.-%, based on the dry layer weight of the radiation-sensitive coating; when monomers/oligomers are used, it is especially preferred that they be present in an amount of 0 to 20 wt.-%.

Optionally, the radiation-sensitive coating of the present invention can also comprise a binder or a mixture of binders. The binder is preferably selected from polyvinyl acetals, acrylic polymers and polyurethanes. It is preferred that the binder contain acid groups, especially preferred carboxy groups. Most preferred are acrylic polymers. Binders with acid groups preferably have acid numbers in the range of 10 to 250 mg KOH/g polymer. Optionally, the binder can comprise unsaturated groups in the main chain or the side chains. Such unsaturated bonds are capable of undergoing a free-radical photopolymerization reaction or another photoreaction, such as e.g. a 2+2-photocycloaddition.

The binder is present in an amount of 0 to 90 wt.-%, based on the dry layer weight, especially preferred 10 to 60 wt.-%.

The radiation-sensitive coating can optionally also comprise small amounts of a thermopolymerization inhibitor in order to prevent an undesired thermopolymerization of the ethylenically unsaturated monomer during the production or storage of the photosensitive composition. Suitable examples of inhibitors of thermopolymerization include e.g. hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of polymerization inhibitor in the photosensitive composition of the present invention is preferably 0 to 5 wt.-%, based on the dry layer weight, especially preferred 0.01 to 2 wt.-%. Such thermopolymerization inhibitors are often introduced into the radiation-sensitive coating via commercial monomers or oligomers and are therefore not expressly mentioned.

Furthermore, the radiation-sensitive coating of the present invention can comprise dyes or pigments for coloring the layer. Examples of colorants include e.g. phthalocyanine pigments, azo pigments, carbon black and titanium dioxide, ethyl violet, crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating of the present invention can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin and tricresyl phosphate. The amount of plasticizer is not particularly restricted, however, it is preferably 0 to 10 wt.-%, based on the dry layer weight, especially preferred 0.25 to 5 wt.-%.

The radiation-sensitive coating can also comprise known chain transfer agents such as e.g. mercapto compounds. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Other optional components of the radiation-sensitive coating are inorganic fillers such as e.g. $Al_2O_3$ and $SiO_2$. They are preferably present in an amount of 0 to 20 wt.-%, based on the dry layer weight, especially preferred 0.1 to 5 wt.-%.

Radiation-Sensitive Elements

The radiation-sensitive elements according to the present invention can e.g. be printing plate precursors (in particular precursors of lithographic printing plates), integrated circuit boards or photomasks.

Substrates

In the production of printing form precursors, a dimensionally stable plate or foil-shaped material is preferably used as a substrate. Preferably, a dimensionally stable plate or foil-shaped material is used that has already been used as a substrate for printing matter. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals (such as a laminate of aluminum and a polyester or polycarbonate), or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to at least one treatment, selected from graining (e.g. by brushing in a dry state or brushing with abrasive suspensions, or electrochemical graining, e.g. by means of a hydrochloric acid electrolyte), anodizing and hydrophilizing.

In order to improve the hydrophilic properties of the surface of the metal substrate that has been grained and optionally anodized in sulfuric acid or phosphoric acid, the metal substrate can be subjected to an aftertreatment with an aqueous solution of sodium silicate, calcium zirconium fluoride, polyvinylphosphonic acid or phosphoric acid. Within the framework of the present invention, the term "substrate" also encompasses an optionally pretreated substrate exhibiting, for example, a hydrophilizing layer on its surface.

The details of the above-mentioned substrate pretreatment are known to the person skilled in the art.

Production

For producing a radiation-sensitive element, the radiation-sensitive composition of the present invention is applied to the surface of the substrate by means of common coating processes (e.g. spin coating, spray coating, dip coating, coating by means of a doctor blade). It is also possible to apply the radiation-sensitive composition on both sides of the substrate; however, for the elements of the present invention, it is preferred that the radiation-sensitive coating be only applied to one side of the substrate.

Usually, the radiation-sensitive composition is applied from an organic solvent or solvent mixture.

Suitable solvents include low alcohols (e.g. methanol, ethanol, propanol and butanol), glycolether derivatives (e.g. ethylene glycol monomethylether, ethylene glycol dimethylether, propylene glycol monomethylether, ethylene glycol monomethylether acetate, ethylene glycol monoethylether acetate, propylene glycol monomethylether acetate, propylene glycol monoethylether acetate, ethylene glycol monoisopropylether acetate, ethylene glycol monobutylether acetate, diethylene glycol monomethylether, diethylene glycol monoethylether), ketones (e.g. diacetone alcohol, acetyl acetone, acetone, methyl ethyl ketone, cyclohexanone, methyl isobutyl ketone), esters (e.g. methyl lactate, ethyl lactate, ethyl acetate, 3-methoxypropyl acetate and butyl acetate), aromatics (e.g. toluene and xylene), cyclohexane, 3-methoxy-2-propanol, 1-methoxy-2-propanol, methoxymethoxyethanol, γ-butyrolactone and dipolar aprotic solvents (e.g. THF, dimethylsulfoxide, dimethylformamide and N-methylpropyrrolidone) and mixtures thereof. The solids content of the radiation-sensitive mixture to be applied depends on the coating method that is used and is preferably 1 to 50 wt.-%.

The dry layer weight of the radiation-sensitive layer is preferably 0.5 to 4 $g/m^2$, more preferably 0.8 to 3 $g/m^2$.

Optional Overcoat Layer

The additional application of a water-soluble oxygen-impermeable overcoat onto the radiation-sensitive layer can be advantageous; an overcoat can considerably reduce or even completely prevent the damaging effects of oxygen to the radiation-sensitive layer. It also protects the radiation-sensitive layer from mechanical damage. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers, polyvinyl methylether, ring-opened copolymers of maleic acid anhydride and a comonomer such as methylvinylether, polyacrylic acid, cellulose ether, and gelatin; polyvinyl alcohol is preferred. The layer weight of the overcoat can e.g. be 0.1 to 6 $g/m^2$, preferably 0.5 to 4 $g/m^2$. However, the printing plate precursors according to the present invention show excellent properties even without an overcoat. The overcoat can also comprise matting agents (i.e. organic or inorganic particles with a particle size of 2 to 20 μm) which facilitate the planar positioning of the film during contact exposure. In order to improve adhesion of the overcoat to the radiation-sensitive layer, the overcoat can comprise adhesion promoters such as poly(vinylimidazole). Further details regarding suitable overcoats can be inferred from WO 99/06890.

Imaging

If the sensitizer absorbs UV/VIS radiation, the thus produced radiation-sensitive elements are image-wise exposed in a manner known to the person skilled in the art with UV/VIS radiation of a wavelength of 250 to 750 nm. For this purpose, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm), argon ion lasers emitting in the visible range (488 nm or 514 nm) and frequency-doubled fd:Nd:YAG lasers emitting at around 532 nm are of particular interest as a radiation source.

If the sensitizer absorbs IR radiation, i.e. noticeably absorbs radiation of a wavelength in the range of more than 750 to 1,200 nm, and preferably shows an absorption maximum in this range in its absorption spectrum, image-wise exposure can be carried out with IR radiation sources. Suitable radiation sources are e.g. semi-conductor lasers or laser diodes which emit in the range of 650 to 1,300 nm, preferably 750 to 1,120 nm, for example Nd:YAG lasers (1,064 nm), laser diodes which emit between 790 and 990 nm, and Ti:sapphire laser. The laser radiation can be digitally controlled via a computer, i.e. it can be turned on or off so that an image-wise exposure of the plates can be effected via stored digitized information in the computer; this way, so-called computer-to-plate (ctp) printing plates can be obtained. Any imagesetters equipped with IR lasers that are known to the person skilled in the art can be used.

During developing, the exposed areas remain on the substrate while the unexposed areas are removed. The unexposed areas are removed with an aqueous alkaline developer or on the printing machine with printing ink and/or fountain solution. The person skilled in the art can easily determine the optimal way of developing a given printing plate precursor, i.e. a certain composition of the radiation-sensitive coating, by carrying out some simple tests.

For this purpose, commercially available developers and developer mixtures can be used which usually have a pH value in the range of 8 to 14, preferably 10 to 14.

It is furthermore advantageous to increase the mechanical strength of the printing layers by subjecting them to a heat treatment (what is referred as "baking") and/or overall exposure (e.g. to UV light). For this purpose, prior to the treatment, the imaged plate is treated with a solution that protects the non-image areas such that the heat treatment does not cause these areas to accept ink. A solution suitable for this purpose is e.g. described in U.S. Pat. No. 4,355,096. Baking usually takes place at temperatures in the range of 150 to 250° C. However, printing plates prepared from printing plate precursors according to the present invention show excellent properties even without having been subjected to a heat treatment/overall exposure. When both baking and overall exposure are carried out, the two treatment steps can be performed simultaneously or one after the other.

Lithographic printing plate precursors according to the present invention are characterized by a high degree of photosensitivity in combination with good storage stability; the developed printing plates exhibit excellent abrasion resistance which allows a large number of copies. Furthermore, the formation of sludge in the developer bath during developing is avoided.

Within the framework of the present invention, the term "radiation-sensitive element" also encompasses an element wherein the substrate comprises a radiation-sensitive coating (and optionally an oxygen-impermeable overcoat) on both sides. However, a one-sided coating is preferred.

The invention will be explained in more detail in the following examples.

EXAMPLES

The abbreviations used hereinafter are explained as follows:

| | |
|---|---|
| Desmodur ® 100 | trifunctional isocyanate of formula (I) wherein $X_1 = X_2 = X_3 =$ hexamethylene, available from Bayer, |
| HMDI | hexamethylene diisocyanate |
| GMMA | glycerin monomethacrylate |
| GDMA | glycerin-1,3-dimethacrylate |
| HEMA | (2-hydroxyethyl)methacrylate |
| PPGMA | polypropylene glycol methacrylate |
| PEGMA | polyethylene glycol methacrylate |
| HEPi | 2-(2-hydroxyethyl)-piperidine |
| HEA | (2-hydroxyethyl)acrylate |
| PETA | pentaerythritol triacrylate |
| DEMA | diethylene glycol methacrylate |
| PC1199 | ethoxylated/propoxylated $C_{10}$-$C_{12}$ alcohol from the company Polygon |
| Rewopol ® NLS28 | Na-laurylsulfate |
| Texapon ® 842 | Na-octylsulfate |
| Nekal ® Paste | Na-methylnaphthalene sulfonate |
| Dowanol PM | propylene glycol monomethylether |

Preparation of Oligomers 1 to 6 and Comparative Oligomers 1 to 12

The corresponding isocyanate, the dibutyltin dilaurate catalyst and the stabilizer 2,6-di-tert.butyl-4-methylphenol were dissolved in methyl ethyl ketone at 40° C.; the amount of methyl ethyl ketone was selected such that the final concentration of non-volatile components was about 30 wt.-%. Then the reaction partner for the isocyanate was added such that the temperature did not exceed 42° C. After 2 hours of stirring, the temperature was increased to 60° C. and maintained for an additional 2 hours. The reaction was monitored by means of IR spectroscopy; isocyanate still present at the end was quenched with suitable amounts of methanol. The formation of oligomers m1 to m6 and comparative oligomers cm1 to cm12 was then confirmed with GPC.

The starting compounds, their amounts, the solids content of the reaction mixture as well as the molecular weight of the resulting products determined by means of GPC can be inferred from Table 1.

TABLE 1

| Oligomer | Isocyanate[1] | Reaction partner[1] | Molecular weight (GPC) | Solids content % |
|---|---|---|---|---|
| m1 | Desmodur ® 100 (1) | GDMA (1.64) GMMA (0.314) PPGMA (1.31) | 5600 | 29.2 |
| m2 | Desmodur ® 100 (1) | GDMA (1.091) GMMA (0.509) PPGMA (1.31) | 6100 | 28.9 |
| m3 | Desmodur ® 100 (1) | GDMA (1.64) GMMA (0.314) PEGMA (1.31) | 4900 | 29.4 |
| m4 | Desmodur ® 100 (1) | GDMA (1.091) GMMA (0.509) PEGMA (1.31) | 6800 | 29.1 |
| m5 | Desmodur ® 100 (1) | GDMA (1.49) GMMA (0.314) HEMA (0.148) PPGMA (1.31) | 5100 | 28.7 |
| m6 | Desmodur ® 100 (1) | GDMA (0.836) GMMA (0.509) HEMA (0.254) PPGMA (1.31) | 5200 | 29.0 |
| cm1 | Desmodur ® 100 (1) | GDMA (2) PPGMA (1) | 3400 | 29.2 |

TABLE 1-continued

| Oligomer | Isocyanate[1] | Reaction partner[1] | Molecular weight (GPC) | Solids content % |
|---|---|---|---|---|
| cm2 | HMDI (2) | HEMA (2) HEPi (1) | not determined | 29.5 |
| cm3 | Desmodur ® 100 (1) | HEA (1.5) PETA (1.5) | not determined | 29.2 |
| cm4 | Desmodur ® 100 (1) | GDMA (3) | not determined | 28.8 |
| cm5 | Desmodur ® 100 (1) | GDMA (1.5) HEMA (1.5) | not determined | 29.5 |
| cm6 | Desmodur ® 100 (1) | GDMA (2.25) HEMA (0.75) | not determined | 31.3 |
| cm7 | Desmodur ® 100 (1) | GDMA (0.75) HEMA (2.25) | not determined | 36.9 |
| cm8 | Desmodur ® 100 (1) | HEMA (3) | not determined | 27.9 |
| cm9 | HMDI (1) | GDMA (2) | not determined | 30.0 |
| cm10 | Desmodur ® 100 (1) | PPGMA (3) | not determined | 27.4 |
| cm11 | Desmodur ® 100 (1) | PEGMA (3) | not determined | 26.8 |
| cm12 | Desmodur ® 100 (1) | GDMA (2) DEMA (1) | not determined | 28.9 |

[1]The numbers in parentheses express the molar ratio.

Examples 1 to 10 and Comparative Examples 1 to 21

An electrochemically grained and anodized aluminum foil was subjected to a treatment with an aqueous solution of polyvinyl phosphonic acid (PVPA). The thus pretreated substrate was coated with a filtered solution as shown in Table 2 or 3 and then dried for 4 minutes at 90° C. The dry layer weight of the photopolymer layer was about 1.7 g/m² in each case.

TABLE 2

(composition sensitive to 405 nm)

| | | |
|---|---|---|
| 36 | ml | propylene glycol monomethylether (Dowanol PM) |
| 24 | ml | methanol |
| 29 | ml | methyl ethyl ketone |
| 6.48 | g | copolymer of methyl methacrylate and methacrylic acid, dissolved in propylene glycol monomethylether (27.9 wt.-% solids content), acid number: 85 |
| 1.12 | g | of a dispersion in propylene glycol monomethylether, comprising 7.25 wt.-% copper phthalocyanine and 7.25 wt.-% of a polyvinylacetal binder comprising 39.9 mole-% vinyl alcohol, 1.2 mole-% vinyl acetate, 15.4 mole-% acetal groups derived from acetaldehyde, 36.1 mole-% acetal groups derived from butyric aldehyde and 7.4 mole-% acetal groups derived from 4-formylbenzoic acid (27% solution in Dowanol PM) |
| 0.08 | g | Kayamer PM-2 (ester of 1 mole phosphonic acid and 1.5 moles hydroxyethyl methacrylate) |
| 10.98 | g | oligomer (see Table 1) |
| 0.6 | g | ethoxylated bisphenol-A-dimethacrylate |
| 1.12 | g | 2-phenyl-4-(2-chlorophenyl)-5-(4-diethylaminophenyl)-oxazole |
| 0.273 | g | 2,2-bis(2-chlorophenyl)-4,5,4',5'-tetraphenyl-2'H-[1,2']biimidazolyl |
| 0.497 | g | mercapto-3-triazole |

TABLE 3

(composition sensitive to 810 to 830 nm)

| | | |
|---|---|---|
| 4.26 | g | binder 1: terpolymer prepared by polymerization of 470 parts by weight styrene, 336 parts by weight methyl methacrylate and 193 parts by weight methacrylic acid, as 30% solution in propylene glycol monomethylether |
| 1.26 | g | binder 2: Ioncryl (acrylic resin from SC Johnson & Son Inc., USA) |
| 9 | g | oligomer (see Table 1) |
| 0.10 | g | N-phenyliminodiacetic acid |
| 0.30 | g | 2-(4-methoxyphenyl)-4,6-trichloromethyl-1,3,5-triazine |
| 0.075 | g | Basonyl Violet 610 from BASF |
| 0.021 | g | phosphoric acid (85%) |

TABLE 3-continued (composition sensitive to 810 to 830 nm)

| | | |
|---|---|---|
| 0.09 | g | IR dye 66e from FEW Chemicals GmbH (Wolfen)[3] |
| 0.33 | g | 5-(4-vinylbenzyl)thio-1,3,4-thiadiazole-2-thiol |
| 30 | ml | propylene glycol monomethylether |
| 3 | ml | acetone |

3)
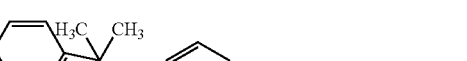
IR 66e

The obtained samples were coated with an overcoat by applying an aqueous solution of poly(vinylalcohol) (Celvol 203 available from Airproducts; degree of hydrolysis: 88%). After drying for 4 minutes at 90° C., a printing plate precursor with a dry layer weight of the overcoat of about 2.5 g/m² was obtained.

The plates prepared with a composition according to Table 2, sensitive to 405 nm, were image-wise exposed with the image-setter Andromeda from Lithotech (30 mW, 405 nm UV laser diode) (a UGRA/FOGRA Postscript strip, version 2.0 ERS, was used for this purpose) and then immediately heated in an oven for 2 minutes at 90° C. The plates were then developed with developer D1 of Table 4.

The plates prepared with a composition according to Table 3 were image-wise exposed with the image-setter Trendsetter 3244 from Creo (40-90 mJ/cm², 830 nm laser diode) and a UGRA/FOGRA Postscript test strip, version 2.0 EPS, which contains different elements for evaluating the quality of copies, was used. Immediately after exposure, the plates were heated in an oven for 2 minutes at 90° C. Developer D2 of Table 4 was subsequently used for developing.

In all exposed and then heated plates, the overcoat was first removed with water and then the various developers were distributed on the plates. After a dwell time of 30 s, the plate was again rubbed with a tampon for another 30 s and then the entire plate was rinsed with water. After this treatment, the exposed portions remained on the plate. For the assessment of their photosensitivity, the plates were blackened in a wet state with printing ink.

TABLE 4

| Developer D1 | Water | 94.84 wt.-% |
| --- | --- | --- |
| | KOH (45 wt.-% solution) | 0.169 wt.-% |
| | PC1199 | 4.992 wt.-% |
| Developer D2 | Water | 91.9 wt.-% |
| | REWOPOL ® NLS 28[2)] | 3.4 wt.-% |
| | 2-phenoxyethanol | 1.8 wt.-% |
| | diethanolamine | 1.1 wt.-% |
| | TEXAPON ® 842 | 1.0 wt.-% |
| | NEKAL ® Paste | 0.6 wt.-% |
| | 4-toluene sulfonic acid | 0.2 wt.-% |

For the preparation of a lithographic printing plate, a printing layer was applied to the aluminum foil, as explained above, exposed, heated, developed, and after rinsing with water, the developed plate was rubbed with an aqueous solution of 0.5% phosphoric acid and 6% gum arabic. The thus prepared plate was loaded in a sheet-fed offset printing machine and used for printing with an abrasive printing ink (Offset S 7184 available from Sun Chemical, containing 10% potassium carbonate). The background areas were examined for possible ink acceptance. The following tests were carried out to determine how the oligomers (I) influence the properties of lithographic printing plates.

Developability

Unexposed 5 cm×30 cm plate strips were heated in an oven for 2 minutes at 90° C., the overcoat was washed off and the strip was dried. The strips were then immersed gradually in the various developers such that every 5 seconds 4 cm more were immersed in the developer bath. After a total dwell time of 50 seconds the strips were removed from the developer bath and the developing time was determined as the time necessary to completely remove the coating. The results can be inferred from Tables 5 and 6.

Photosensitivity (1) Plates Sensitive to 405 nm:
Sensitivity was determined by means of overall exposure with the exposure unit mentioned above for this type of plate. The sensitivity was defined as the energy necessary to obtain two steps of the UGRA gray scale. Both fresh and aged plates (thermal ageing: 1 hour at 90° C.) were examined. The results can be inferred from Table 5.

(2) Plates Sensitive to 830 nm:
Sensitivity was determined using different energy values using the exposure unit mentioned above for this type of plate. The sensitivity of a certain plate was defined as the energy necessary to obtain a clean image of all microelements of the UGRA/FOGRA Postscript strip version 2.0 ERS. Both fresh and aged plates (thermal ageing: 16 hours at 60° C.) were examined. The results can be inferred from Table 6.

Formation of Sludge in the Developer Bath

For the evaluation of the formation of sludge, the following method was used.

A Raptor Polymer HW type processor from Glunz & Jensen, which can be used to preheat the plates (110° C. measured at the back side of the plate), wash off the overcoat with tap water, develop the plate with the help of two brushes at 23° C. for 20 seconds, rinse the plate with tap water and gum the plates with the gumming solution 850 S from Kodak Polychrome Graphics, was filled with the different developers (see Table 4). Each plate was exposed with a 5% screen before it was processed in the above-mentioned processor.

After 45 m$^2$ of a certain plate per liter of developer have been developed, the developer bath was emptied. The developer bath of the processor was then examined for residual sludge; if applicable, the removability of the sludge was evaluated subsequently. The following evaluation scale was used:

(A) no or very little formation of sludge,
(B) formation of sludge; could easily be removed by rinsing with tap water,
(C) formation of sludge; could only be removed after prolonged rinsing with tap water,
(D) formation of sludge: could not be removed by rinsing with tap water but required the use of the cleanser dipropylene glycol monomethylether.

The results can be inferred from Tables 5 and 6.

Dot Loss

The term "dot loss" describes the change in the tonal values (TV) of a linearized plate during printing. Linearization means that deviations from a predetermined set tonal value (STV) are compensated for by means of RIP software (RIP=raster image processor). The accessible measured values are the tonal values before printing (TVB) and the tonal values after printing (TVA) on the printing form. For determining the dot loss, the linearized tonal values before printing (TVB) are measured. The linearized and developed printing plate described in the present invention is used in a printing machine for 10,000 prints, cleaned and then again subjected to a tonal value examination, which shows the tonal values after printing (TVA). Then the dot loss is calculated using equation 1 integrating all predetermined set tonal values (STV).

$$\text{Dot loss} = \int_0^{100} [TVB - STV] dSTV - \int_0^{100} [TVA - STV] dSTV \quad (1)$$

Ideally, the dot loss should converge toward zero. In other words: The lower the loss in tonal value, the better the plate.

The plates of Comparative Examples 1 and 11, i.e. plates with a considerable dot loss during printing at different tonal values, are used as a reference. The relative dot loss is calculated using equation (2) below:

$$\text{relative dot loss} = \frac{\text{dot loss(sample)}}{\text{dot loss(reference)}} \cdot 100\% \quad (2)$$

The results can be inferred from Tables 5 and 6.

Print Run Length

The criterion for the obtainable print run length was determined to be the point in time when abrasion of the image areas of a printing plate could be observed with the naked eye.

Tackiness

Tackiness is another problem that can arise in photopolymer plates. It is difficult to produce such plates on a large scale since during production rollers come into contact with the photopolymer surface. It is therefore advisable to keep tackiness as low as possible. Tackiness was examined by first pressing on the plate with a previously degreased thumb and then again with a thumb covered with a laboratory latex glove.

The following evaluation scale was used:

(1) excellent; no tackiness was observed either with or without the glove;
(2) good; slight tackiness was found with the glove, no tackiness with the naked thumb;

(3) acceptable; slight tackiness both with and without the glove;
(4) not acceptable; considerable tackiness with the glove, no or only slight tackiness without glove;
(5) not acceptable; considerable tackiness both with and without the glove.

The results can be inferred from Tables 5 and 6.

A comparison of the results shows that a use of the oligomers m1 to m6 according to the present invention only leads to a negligible formation of sludge even at high loads; furthermore, improved developability, improved thermal stability and a higher degree of sensitivity were found compared to the use of the comparative monomers cm1 to cm11. The print run length obtained during printing was not affected by monomers m1 to m6.

TABLE 5

(plates sensitive to 405 nm)

| Example | Oligomer | Developability (s) | Sensitivity of a fresh plate ($\mu J/cm^2$) | Sensitivity of a plate subjected to a heat treatment ($\mu J/cm^2$) | Formation of sludge | Tackiness | Dot loss after 100,000 copies % | Print run length |
|---|---|---|---|---|---|---|---|---|
| 1 | m1 | 5 | 35 | 35 | A | 1 | 55 | >100,000 |
| 2 | m2 | 5 | 40 | 45 | A | 1 | 60 | >100,000 |
| 3 | m3 | 5 | 30 | 35 | A | 2 | 55 | >100,000 |
| 4 | m4 | 5 | 40 | 40 | A | 2 | 70 | >100,000 |
| Comp. 1 | cm1 | 8 | 35 | 40 | B | 2 | 65 | >100,000 |
| Comp. 2 | cm2 | 20 | 65 | 95 | D | 2 | 100 | >100,000 |
| Comp. 3 | cm3 | 16 | 60 | 95 | C | 2 | 90 | >100,000 |
| Comp. 4 | cm4 | 16 | 75 | 105 | D | 3 | 95 | >100,000 |
| Comp. 5 | cm8 | 24 | 65 | 105 | D | 4 | 120 | abrasion at 80,000 |
| Comp. 6 | cm9 | 24 | 110 | 120 | C | 2 | 115 | abrasion at 70,000 |
| Comp. 7 | cm10 | 4 | no image obtained | no image obtained | B | 2 | 150 | — |
| Comp. 8 | cm11 | 4 | no image obtained | no image obtained | B | 2 | 180 | — |
| Comp. 9 | cm12 | 4 | 60 | 85 | D | 3 | 110 | >100,000 |

TABLE 6

(plates sensitive to 810-830 nm)

| Example | Oligomer/Monomer | Developability (s) | Sensitivity of a fresh plate ($mJ/cm^2$) | Sensitivity of a plate subjected to a heat treatment ($mJ/cm^2$) | Formation of sludge | Tackiness | Dot loss after 100,000 copies % | Print run length |
|---|---|---|---|---|---|---|---|---|
| 5 | m1 | 5 | 45 | 50 | A | 2 | 20 | >100,000 |
| 6 | m2 | 5 | 50 | 60 | A | 2 | 35 | >100,000 |
| 7 | m3 | 5 | 60 | 65 | A | 2 | 28 | >100,000 |
| 8 | m4 | 5 | 53 | 58 | A | 2 | 38 | >100,000 |
| 9 | m5 | 5 | 48 | 55 | A | 2 | 32 | >100,000 |
| 10 | m6 | 5 | 52 | 57 | A | 2 | 27 | >100,000 |
| Comp. 10 | cm1 | 8 | 45 | 50 | B | 2 | 30 | >100,000 |
| Comp. 11 | cm2 | 16 | 75 | 95 | D | 2 | 100 | >100,000 |
| Comp. 12 | cm3 | 16 | 45 | 80 | C | 2 | 110 | >100,000 |
| Comp. 13 | cm4 | 20 | 40 | 85 | C | 3 | 120 | >100,000 |
| Comp. 14 | cm5 | 20 | 55 | 75 | C | 3 | 120 | >100,000 |
| Comp. 15 | cm6 | 16 | 60 | 90 | C | 3 | 110 | >100,000 |
| Comp. 16 | cm7 | 16 | 65 | 95 | C | 3 | 130 | >100,000 |
| Comp. 17 | cm8 | 20 | 40 | 90 | D | 4 | 70 | >100,000 |
| Comp. 18 | cm9 | 20 | 65 | 95 | D | 3 | 120 | >100,000 |
| Comp. 19 | cm10 | 20 | 180 | 190 | B | 2 | 170 | abrasion at 40,000 |
| Comp. 20 | cm11 | 20 | 190 | 190 | B | 2 | 190 | abrasion at 40,000 |
| Comp. 21 | cm12 | 12 | 55 | 75 | C | 3 | 20 | >100,000 |

The invention claimed is:

1. Process for producing an imaged element comprising
(a) image-wise exposure of a radiation-sensitive element to radiation of a wavelength adjusted to a photoinitiator or sensitizer present in the radiation-sensitive coating of the element,
wherein the radiation-sensitive element is a negative-working lithographic printing plate precursor comprising an aluminum-containing substrate, and a radiation-sensitive coating comprising:
at least one component selected from photoinitiators and sensitizer/coinitiator systems that absorb radiation of a wavelength in the range of 250 to 1,200 nm: and
at least one free-radical polymerizable oligomer A having an average molecular weight in the range of 3,500 to 9,000 determined by GPC, obtainable by reacting a triisocyanate with (i) at least one acrylic or methacrylic monomer with two free OH groups and at least one (meth)acrylic group and (ii) at least one compound comprising one OH group, at least one (meth)acrylic group and at least one poly(alkyleneoxide) chain in the molecule, wherein the (meth)acrylic monomer (i) is present in an amount of 2 to 20 mole-%, based on the total amount of (meth)acrylic compounds with OH functionality; and (b) removing the non-exposed areas on press by means of printing ink, fountain solution, or both printing ink and fountain solution.

2. The process of claim 1, wherein the image-wise exposed element obtained in (a) is heated prior to (b).

3. The process of claim 1 wherein the imaged element obtained in (b) is heated or subjected to overall exposure.

4. The process of claim 1 wherein the triisocyanate used to obtain the free-radical polymerizable oligomer A is furthermore reacted with (iii) at least one acrylic or methacrylic monomer comprising one free OH group and at least one (meth)acrylic group but no poly(alkyleneoxide) chain.

5. The process of claim 1 wherein the triisocyanate used to obtain the free-radical polymerizable oligomers A is selected from triisocyanates of the following formulas (I), (II) and (III-1) to (III-7)

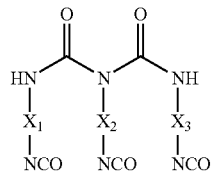
(I)

wherein $X_1$, $X_2$ and $X_3$ are independently selected from aliphatic or cycloaliphatic $C_4$-$C_{12}$ spacers, araliphatic $C_8$-$C_{12}$ spacers and aromatic $C_6$-$C_{10}$ spacers;

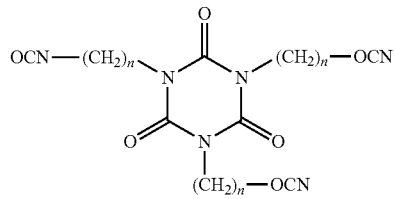
(II)

wherein n is an integer from 1 to 10;

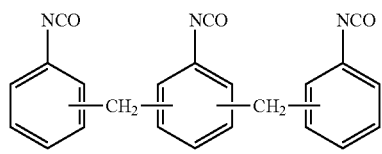
(III-1)

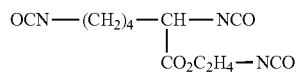
(III-2)

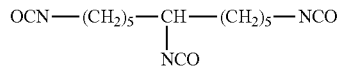
(III-3)

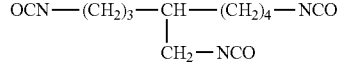
(III-4)

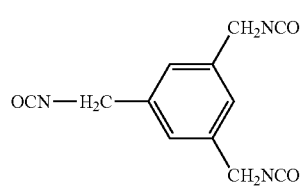
(III-5)

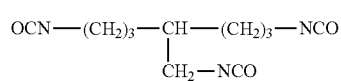
(III-6)

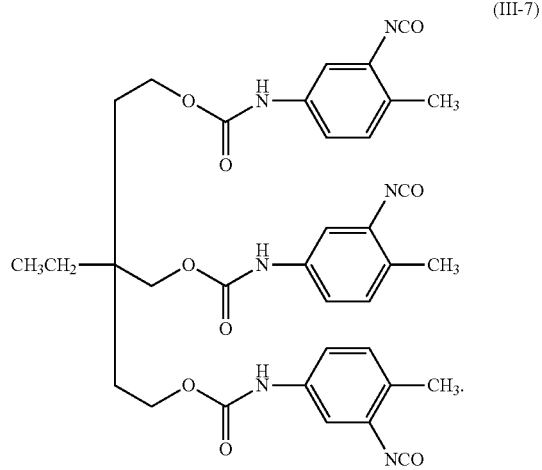
(III-7)

6. The process of claim 5 wherein the triisocyanate used to obtain the free-radical polymerizable oligomers A is a triisocyanate of formula (I) wherein $X_1$=$X_2$=$X_3$.

7. The process of claim 6 wherein $X_1$=$X_2$=$X_3$=hexamethylene.

8. The process of claim 1 wherein the poly(alkyleneoxide) chain is a poly(ethyleneoxide) or poly(propyleneoxide) chain with a degree of polymerization of at least 3.

9. The process of claim 1 wherein the (meth)acrylic monomer (i) with 2 free OH groups and at least one (meth)acrylic group is selected from pentaerythritol di(meth)acrylate, glycerin mono(meth)acrylate, trimethylolpropane mono(meth)acrylate, trimethylolethane mono(meth)-acrylate, trimethylolbutane mono(meth)acrylate, sorbitol tetra(meth)acrylate and mixtures thereof.

10. The process of claim 1 wherein the compound (II) is selected from poly(ethyleneoxide)mono(meth)acrylate, poly(propyleneoxide) mono(meth)acrylate, random copolymers or block copolymers of propylene oxide and ethylene oxide, esterified with (meth)acrylic acid at one end, ethoxylated and/or propoxylated glycerin, diesterified with (meth)acrylic acid, and mixtures thereof.

11. The process of claim 4 wherein the compound (iii) is selected from pentaerythritol tri(meth)acrylate, glycerin di(meth)acrylate, trimethylolpropane di(meth)acrylate, trimethylolethane di(meth)acrylate, trimethylolbutane di(meth)acrylate, trimethylolbutane di(meth)acrylate, sorbitol penta (meth)acrylate and mixtures thereof.

12. The process of claim 1 wherein the radiation-sensitive coating furthermore comprises at least one additional component selected from binders, thermopolymerization inhibitors, colorants, plasticizers, chain transfer agents, leuco dyes, inorganic fillers and surfactants.

13. The process of claim 1 wherein the radiation-sensitive coating furthermore comprises a tri(meth)acrylate of a trishydroxy compound.

14. The process of claim 1 wherein the at least one component absorbs radiation of a wavelength in the range of 250 to 750 nm.

15. The process of claim 1 wherein the at least one component absorbs radiation of a wavelength in the range of more than 750 to 1,200 nm.

16. The process of claim 1 wherein the radiation-sensitive element comprises an oxygen-impermeable overcoat provided on top of the radiation-sensitive coating.

* * * * *

UNITED STATES PATENT AND TRADEMARK OFFICE
CERTIFICATE OF CORRECTION

PATENT NO. : 8,119,331 B2
APPLICATION NO. : 12/159287
DATED : February 21, 2012
INVENTOR(S) : Harald Baumann et al.

Page 1 of 1

It is certified that error appears in the above-identified patent and that said Letters Patent is hereby corrected as shown below:

In Column 37, Claim 5, lines 35 - 43, delete the structure:

"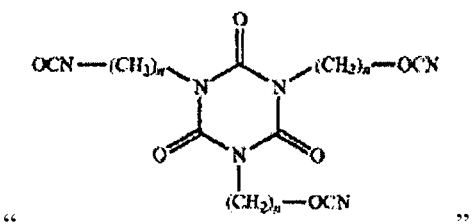"

and insert

--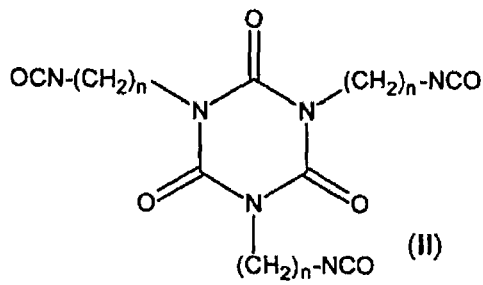--.

Signed and Sealed this
Nineteenth Day of March, 2013

Teresa Stanek Rea
*Acting Director of the United States Patent and Trademark Office*